United States Patent [19]

Boyko et al.

[11] Patent Number: 5,784,782
[45] Date of Patent: Jul. 28, 1998

[54] METHOD FOR FABRICATING PRINTED CIRCUIT BOARDS WITH CAVITIES

[75] Inventors: Christina Marie Boyko, Vestal; Donald Seton Farquhar, Endicott; Robert Maynard Japp, Vestal; Michael Joseph Klodowski, Endicott, all of N.Y.

[73] Assignee: International Business Machines Corporation, Armonk, N.Y.

[21] Appl. No.: 709,373

[22] Filed: Sep. 6, 1996

[51] Int. Cl.⁶ .............. H05K 3/10; H05K 3/36; H05K 3/42; H05K 3/46
[52] U.S. Cl. .............. 29/848; 29/830; 29/851; 29/852; 156/289; 156/323; 174/254; 174/255; 361/750; 427/97; 427/98; 428/901
[58] Field of Search ............. 29/830, 840, 846, 29/848, 851, 852; 156/289, 293, 323; 174/254, 255; 228/180.22; 361/750; 427/96–98; 437/230, 247, 248

[56] References Cited

U.S. PATENT DOCUMENTS

| | | | |
|---|---|---|---|
| 4,636,275 | 1/1987 | Norell | 156/289 |
| 4,643,935 | 2/1987 | McNeal et al. | 428/157 |
| 4,680,075 | 7/1987 | McNeal et al. | 156/323 X |
| 4,689,879 | 9/1987 | Fowler | 29/830 X |
| 4,916,808 | 4/1990 | Sanborn et al. | 29/830 X |
| 4,959,008 | 9/1990 | Wasulko | 174/255 X |
| 5,095,628 | 3/1992 | McKenney et al. | 29/846 |
| 5,144,534 | 9/1992 | Kober | 29/852 X |
| 5,220,723 | 6/1993 | Okada | 29/830 |
| 5,262,594 | 11/1993 | Edwin et al. | 174/254 |
| 5,288,542 | 2/1994 | Cibulsky et al. | 361/750 X |
| 5,346,117 | 9/1994 | Kohn et al. | 228/180.22 |

FOREIGN PATENT DOCUMENTS

| | | | |
|---|---|---|---|
| 5299801 | 11/1993 | Japan | 29/830 |
| 6177545 | 6/1994 | Japan | 29/830 |
| 9311652 | 6/1993 | WIPO | 29/852 |

*Primary Examiner*—Peter Vo
*Attorney, Agent, or Firm*—Arthur J. Samodovitz

[57] ABSTRACT

A method for making a printed circuit with a cavity is disclosed. The method comprises the step of laying a sticker sheet on a first, metallized dielectric layer and laying a second, metallized dielectric layer on the sticker sheet. The second metallized dielectric layer and the sticker sheet each have a window which is registered with the other window forming a cavity. Next, a flexible release layer is laid above the second metallized dielectric layer and a thermosetting visco-plastic material is laid on the release layer over the cavity. Next, the first and second metallized dielectric layers, sticker sheet, release layer and visco-plastic material are laminated by heat and pressure to cure the sticker sheet and thereby bind the first and second metallized dielectric sheets to each other. During the lamination step, the sticker sheet flows to the perimeter of the cavity. However, the pressure forces the visco-plastic material tightly into the cavity to seal a bottom perimeter of the cavity such that the sticker sheet forms a smooth fillet at the bottom perimeter of the cavity.

18 Claims, 9 Drawing Sheets

METHOD FOR FABRICATING PRINTED CIRCUIT BOARDS WITH CAVITIES

BACKGROUND OF THE INVENTION

The invention relates generally to printed circuit boards, and deals more particularly with a method for fabricating printed circuit boards having cavities.

Printed circuit boards (PCBs) are well known and comprise one or more layers of dielectric material with metallizations on one or both surfaces of each layer. The dielectric layers may be made from glass-reinforced polyimide, Teflon (a trademark of E. I. duPont de Nemours) or epoxy. The metallizations comprise conductors, pads, surface lands, ground planes and power planes. Layers of different dielectric materials can be laminated together into the same board.

Some boards require cavities in one or more layers of the PCB. The cavity may be entirely plated and grounded and used to house a power amplifier to reduce stray emissions. The leads of the chip may pass through the plating at the bottom of the cavity and pass through the lower layers for attachment at the opposite face of the PCB. Alternately, the cavity can house a wire-bond chip oriented such that the connecting pads are face up.

It was known to fabricate a PCB with a cavity as follows. A window is cut-out in an epoxy core layer and a matching window is cut-out in an epoxy-glass sticker sheet. The sticker sheet may comprise "Pre-Preg" and is formed as follows. A fiberglass cloth, woven Kevlar(tm) or other woven or non-woven glass cloth is dipped into a solution comprising epoxy and a solvent/thinner. Then the cloth is pressed through rollers to squeeze out excess epoxy and thinner. Next, the cloth is partially dried to remove the solvent and partially cure the epoxy. The degree to which the epoxy remains uncured determines the degree to which the pre-preg will flow when subsequently laminated.

The epoxy core layer and epoxy-glass sticker sheet are laid on a solid Teflon-glass core layer with the sticker sheet in the middle such that the windows in the epoxy core layer and epoxy-glass sticker sheet are registered with each other. Then, the laminate is heated to fully cure the epoxy-glass sticker sheet and thereby bond the epoxy core layer to the Teflon-glass core.

However, a problem has resulted in that a "high-flow" type of epoxy-glass sticker sheet (i.e. relatively uncured before lamination) seeps into the cavity in the epoxy core layer during lamination thereby covering the metallization on the Teflon-glass core layer. A "no-flow" or "low flow" type of epoxy-glass sticker sheet will reduce such seepage but is much more expensive than the "high-flow" type and tends to trap air during the heating/lamination process. Also, the windows in the low-flow sticker sheet must be closely tailored to the windows in the epoxy core layer before lamination, for example a 0.02" recess back from each side of the window to permit the epoxy-glass sticker material to flow to the edges of the window in the epoxy core layer. Even with this precision, the low-flow epoxy-glass sticker material does not form a good seal at the base perimeter of the cavity due in part to the substantially pre-cured nature of the epoxy. Ideally, there would be a continuous fillet of the epoxy-glass sticker material at the base perimeter of the cavity to form a good seal between the epoxy core layer and the Teflon-glass core layer and not cover the bottom of the cavity.

U.S. Pat. No. 4,636,275 discloses an elastic bladder which is pressed by a fluid into a cavity in epoxy glass layers to seal the layers while adhesive between the layers is cured.

U.S. Pat. Nos. 4,643,935 and 4,680,075 disclose a thermo-plastic plug which is initially shaped by pressing a thermo-plastic blank into a dummy cavity. Then, the plug is inserted into a similarly-shaped cavity in a real multi-layer board, and the multi-layer board is laminated. The plug deters seepage.

While thermoplastic materials are generally effective to plug cavities, the thermoplastic materials become softer and softer with rising temperature, i.e. they melt. Some lamination processes require such high temperature that the thermoplastic material may be too soft to effectively dam a high flow pre-preg sticker sheet.

A general object of the present invention is to fabricate a printed circuit board laminate with a cavity in one or more layers in such a way that is cost effective, forms a good seal at the base perimeter of the cavity, securely bonds the layers together and does not permit adhesive from between the layers to coat the bottom of the cavity.

SUMMARY OF THE INVENTION

The invention resides in a method for fabricating a printed circuit board with a cavity. The method comprises the step of laying a sticker sheet on a first, metallized dielectric layer and laying a second, metallized dielectric layer on the sticker sheet. The second metallized dielectric layer and the sticker sheet each have a window which is registered with the other window forming a cavity. Next, a flexible release layer is laid above the second metallized dielectric layer and a thermosetting visco-plastic material is laid on the release layer over the cavity. Next, the first and second metallized dielectric layers, sticker sheet, release layer and visco-plastic material are laminated by heat and pressure to cure the sticker sheet and thereby bind the first and second metallized dielectric sheets to each other. During the lamination step, the sticker sheet flows to the perimeter of the cavity. However, the pressure forces the visco-plastic material tightly into the cavity to seal a bottom perimeter of the cavity such that the sticker sheet does not seep onto much of a floor of the cavity. Instead, the sticker sheet forms a fillet at the bottom perimeter of the cavity.

If desired, the cavity can be plated and grounded, and an electronic component such as an amplifier can be mounted in the cavity such that the plating forms an electromagnetic shield for the amplifier. The invention also resides in the final product, i.e. a plated cavity.

DETAILED DESCRIPTION OF THE PREFERRED EMBODIMENTS

Figure 1:
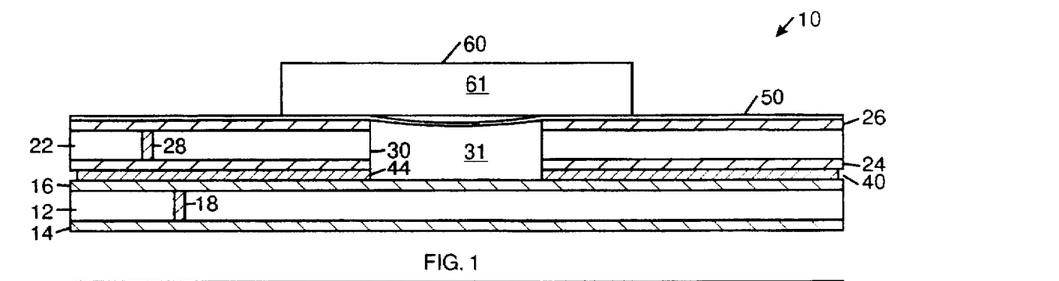
FIG. 1 illustrates components of a printed circuit board during an intermediate stage in fabrication according to the present invention.
Figure 2:
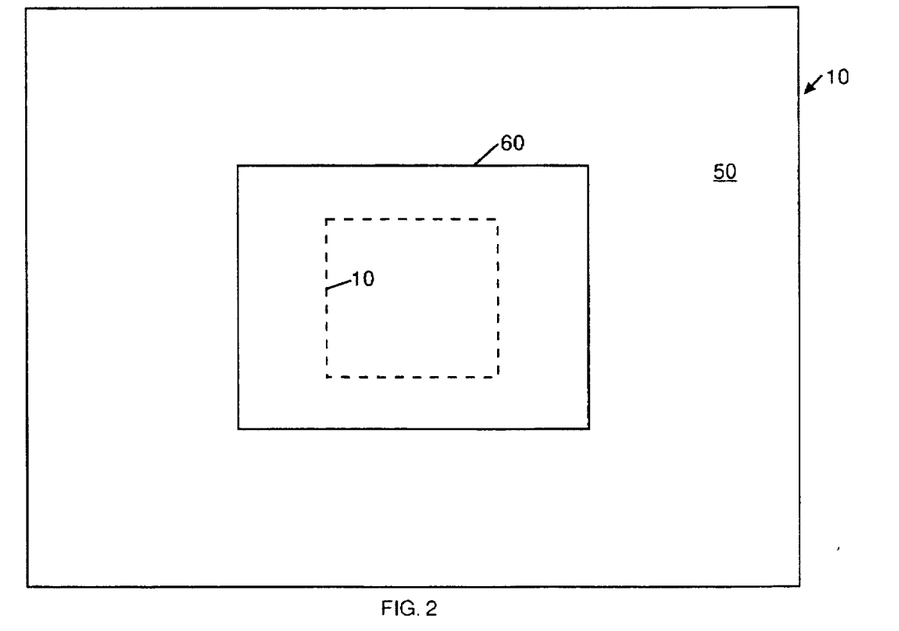
FIG. 2 is a top view of FIG. 1.

Referring now to the drawings in detail, wherein like reference numbers indicate like elements throughout, FIGS. 1–7 illustrate a method for fabricating a printed circuit board generally designated 10 according to the present invention. FIG. 1 illustrates the layers of the printed circuit board 10 before lamination. More specifically, FIG. 1 illustrates a dielectric layer 12 such as Teflon-glass core with metallizations 14 and 16 on both surfaces. By way of example, metallization 16 is a ground plane and metallization 14 comprises conductors. A metal via 18 also passes through dielectric layer 12. FIG. 1 also illustrates another dielectric layer 22 such as epoxy core with metallizations 24 and 26 on both surfaces. By way of example, metallization 24 comprises conductors and metallization 26 comprises conductors and surface lands for electronic components. A metal via 28 also passes through dielectric layer 22. As illustrated in FIGS. 1 and 2, a window 30 was cut in dielectric layer 22 to form a cavity 31. By way of example, the window was cut by routing or punching. The resultant cavity 31 can be various shapes such as rectangular as shown (or circular). The dimensions of the cavity can also vary greatly. For a cavity depth of 0.025", the minimum diameter/width of the cavity would be about 0.100" and for a cavity depth of 0.005", the minimum diameter/width of the cavity would be about 0.020".

Sticker/adhesive sheet 40 (which may actually comprise two or more separate sticker sheets as desired) such as epoxy-glass or "pre-preg" is located between metallized dielectric sheets 12 and 22. The pre-preg is "high-flow", for example, pre-cured about 20% and is 0.007" thick. (Other pre-pregs of about 15–40% curing will also suffice.) A window 44 was also cut in sticker sheet 40, and this window is registered with window 30 in dielectric layer 22, except that window 44 is cut-back 0.020"–0.080" from the perimeter of window 30.

A release layer 50 lies on top of metallized dielectric layer 22. By way of example, release layer 50 comprises highly stretchable and conformable tetrafluoroethylene-perfluoroalkyl vinyl ether or "PFA" (tm) material by E. I. du Pont De Nemours. The PFA material is a Teflon co-polymer in the range of 0.0005"–0.002" thick. An alternate material is fluorinated ethylene propylene or "FEP" which is also a Teflon co-polymer.

A sheet 60 of plug material 61 is laid on top of release layer 50. The plug material is a thermosetting visco-plastic polymer. At room temperature, the material is soft and deformable, and will readily conform to fine features (0.001"), but as temperature increases, the viscosity decrease in the material is counteracted by cross-linking ("reactivity") within the material. This prevents the material from melting. Thus, at room temperature the material is pliable enough to tightly conform to the cavity 31 and seal in the sticker sheet 40 at the base of cavity 31. A shear modulus of about 100–400 KPa is preferred at room temperature. The shear modulus indicates the material's mechanical resistance to deformation by shearing force. When heated during the lamination of the printed circuit board, the material 61 maintains sufficient shear resistance to retain its shape and continue to prevent the epoxy of the sticker sheet from seeping into the cavity. A minimum shear modulus of about 10 KPa for material 61 is preferred during the curing process.) By way of example, the material of sheet 60 is General Sealant's "GS-43 MR" material, and the sheet 60 is ⅛" thick and extends beyond hole 30 by ⅛" on all sides. Alternately, material 61 could be a catalyzed silicone rubber, such as General Electric Co. GE 6075 general Purpose Elastomer. The following table indicates the shear modulus of each material as a function of temperature:

| Temperature | Shear Modulus GS 43MR | Shear Modulus GE 6075 |
|---|---|---|
| 20 C. | 120 KPa | 300 KPa |
| 50 C. | 80 KPa | 290 KPa |
| 100 C. | 30 KPa | 275 KPa |
| 150 C. | 10 KPa | 700 KPa |
| 200 C. | 40 KPa | 2000 KPa |

Figure 3:
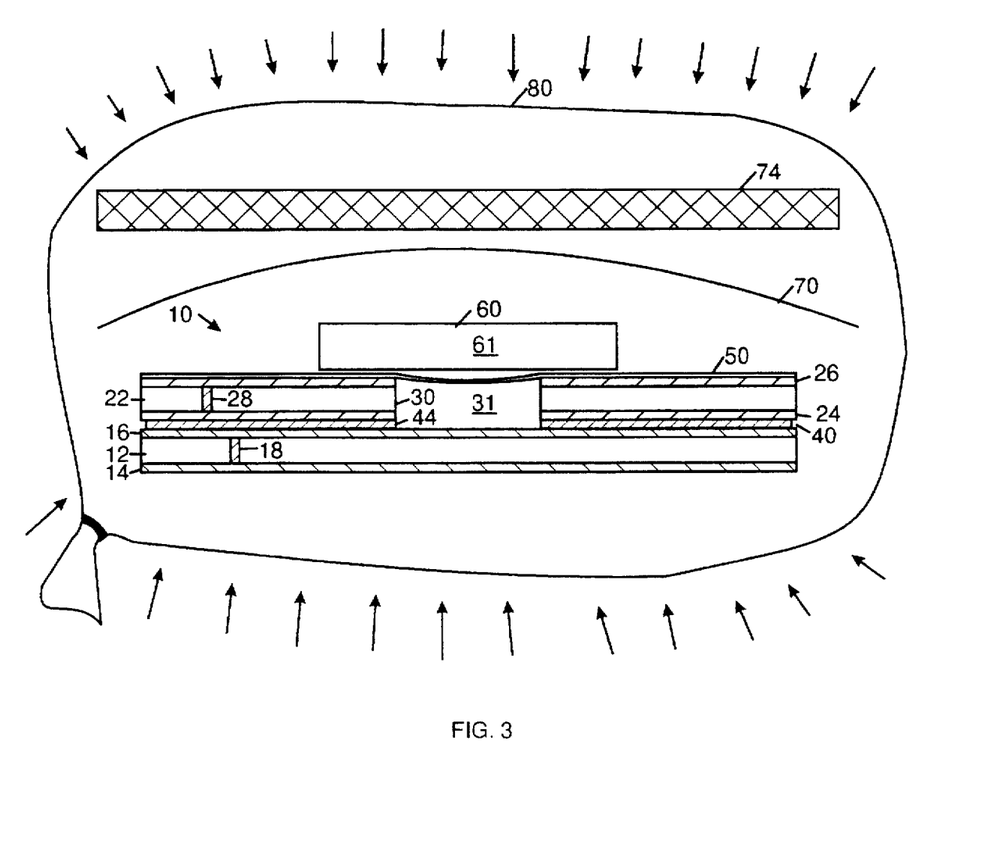
FIG. 3 illustrates the printed circuit board of FIG. 1 during a later stage in the fabrication process.

Next as illustrated in FIG. 3, the foregoing layers are prepared for lamination as follows. Another non-melting release layer 70 is laid over sheet 60. By way of example, release layer 70 comprises pure Teflon 0.001–0.002" thick. Then, a breather layer 74, for example, Airtech Corporation's "Super Breather" woven nylon sheet 0.375" thick is laid over release layer 70. Next the complete structure is placed in a 0.002" thick nylon bag 80 and the bag is evacuated and sealed. Finally, the nylon bag and contents are placed in an autoclave and subjected to heat and pressure, for example 350°–400° F. and 200 PSI for a typical epoxy resin suitable for printed circuit boards.

Figure 4:
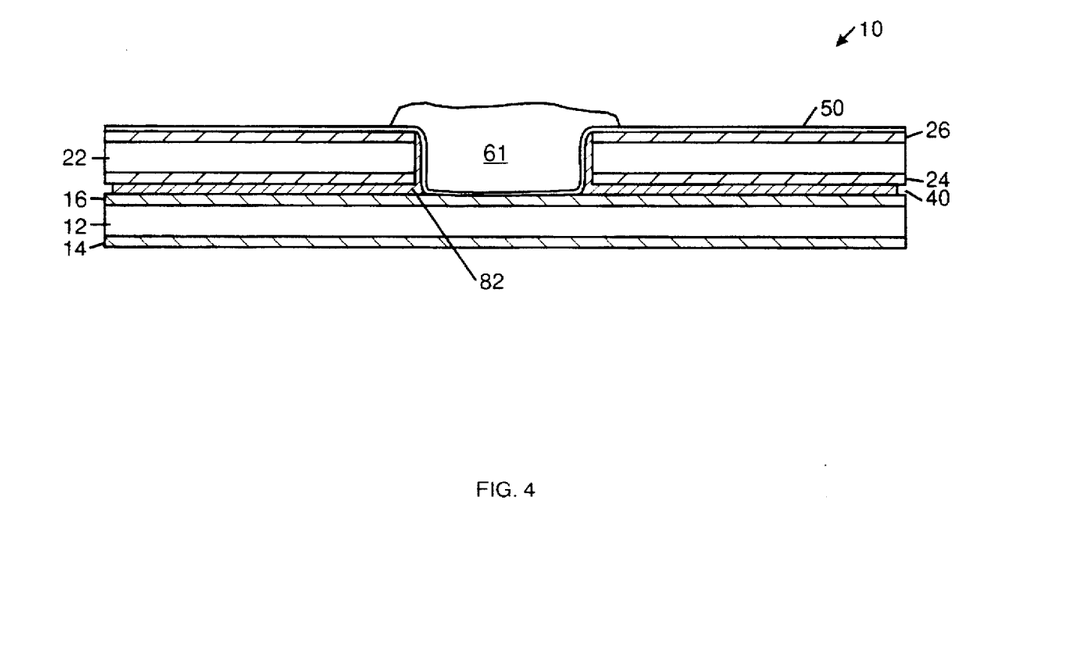
FIG. 4 illustrates the printed circuit board of FIG. 3 during a still later stage in the fabrication process.

As illustrated in FIG. 4 where the release layer 70, sheet 74 and bag 80 are removed, the heat and pressure caused the sticker sheet to bind ground plane 16 to metallized dielectric layer 22 and cause the sticker sheet material to flow to and slightly within the base perimeter of the cavity 31 where it is dammed by the plug material 61 and release layer 50. This leaves a fillet 82 of the sticker sheet material along the bottom perimeter of the cavity. This fillet has a smooth, concave surface which minimizes stress concentrations and the tendancy to trap fluids or contaminants during subsequent processing. By way of example, the sticker sheet material flows 0.050" within the base perimeter of the cavity. The distance that the sticker sheet material flows into the cavity depends on the viscosity of the plug material 61, thickness of release layer 70 and flexibility of release layer 70.

Figure 5:
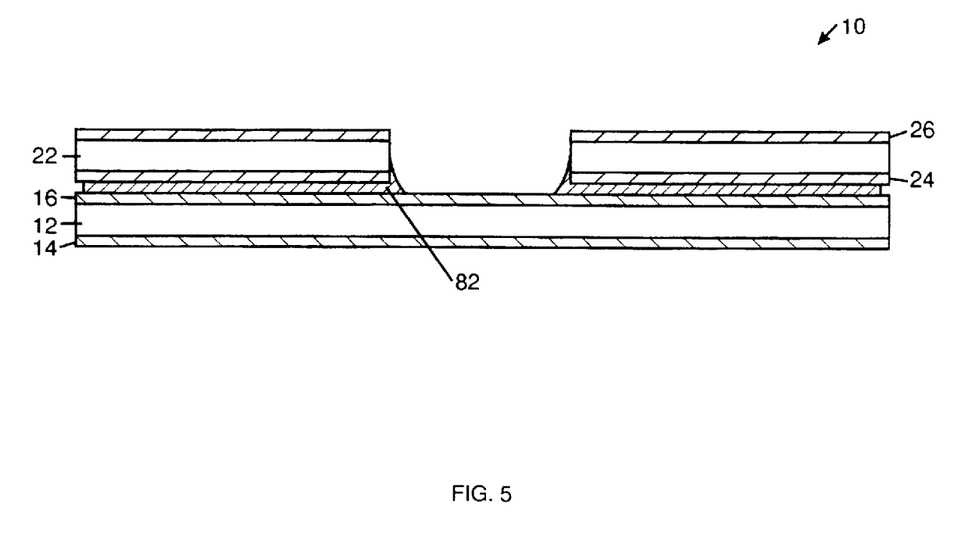
FIG. 5 illustrates the printed circuit board of FIG. 4 during a still later stage in the fabrication process, i.e. after the layers are laminated and a cavity is formed.

After the foregoing lamination process is complete, the release layer 50 and plug material 61 are removed leaving the printed circuit board 10 as illustrated in FIG. 5.

For some applications, plating of the cavity is required. Accordingly, cavity 31 is prepared for plating using hole clean (desmear) processes that are standard in the printed circuit industry. One such process would include three steps, the first of which is organic solvent such as n-methyl pyrrolidone to soften the epoxy. The second step is either potassium or sodium permanganate, which etches the epoxy surface. The third and final step is a neutralizer, such as hydrogen peroxide/sulfuric acid, which stops the permanganate etching reaction.

Figure 6:
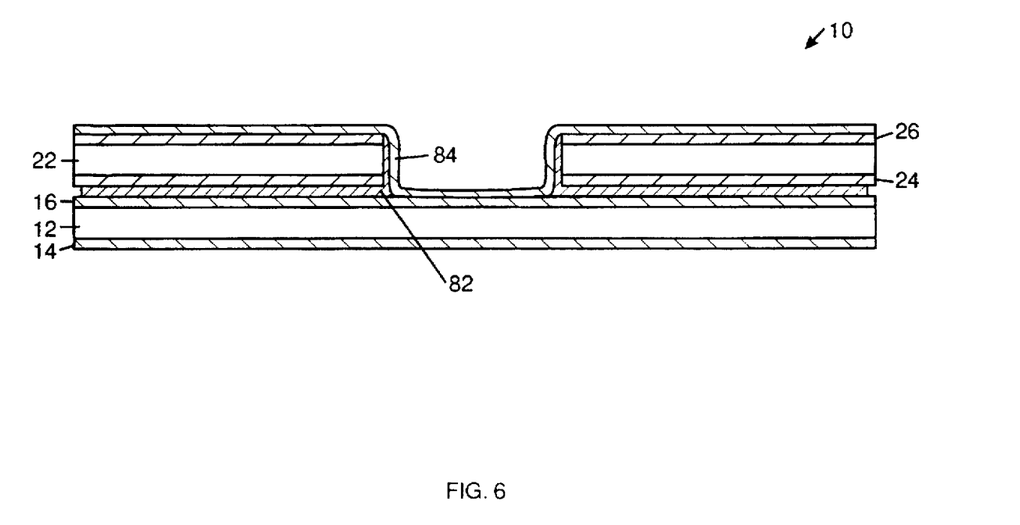
FIG. 6 illustrates the printed circuit board of FIG. 5 during a still later stage in the fabrication process, i.e. after the cavity is plated.

Next, an electroless copper plating process is used to deposit a thin layer of copper on the fillet surface. A typical electroless copper thickness is 30–50 microinches. Next, copper is electrolytically plated to yield a plate 84 as illustrated in FIG. 6. An acid copper bath is typically used for this step. Plate 84 is electrically connected to metallizations 16 and 26 and is typically grounded.

Figure 7:
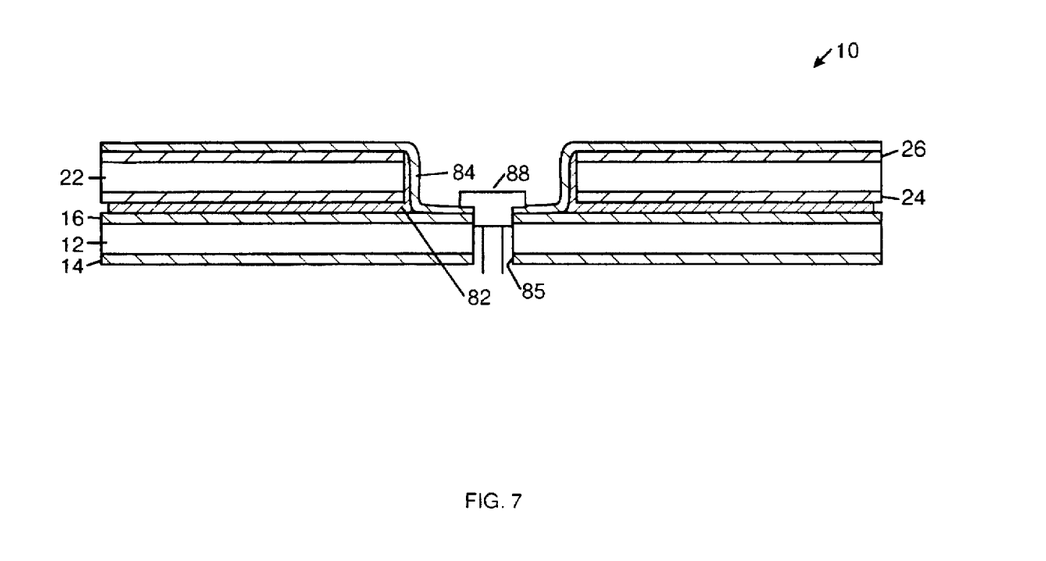
FIG. 7 illustrates the printed circuit board of FIG. 6 during a still later stage in the fabrication process, i.e. after an electronic component is mounted within the plated cavity.

FIG. 7 illustrates that a hole 85 has been subsequently drilled within the cavity through plate 84 and metallized dielectric layer 12. An electronic component 88, such as a transistor, is mounted in the resultant hole with its leads extending through the hole.

Figure 8:
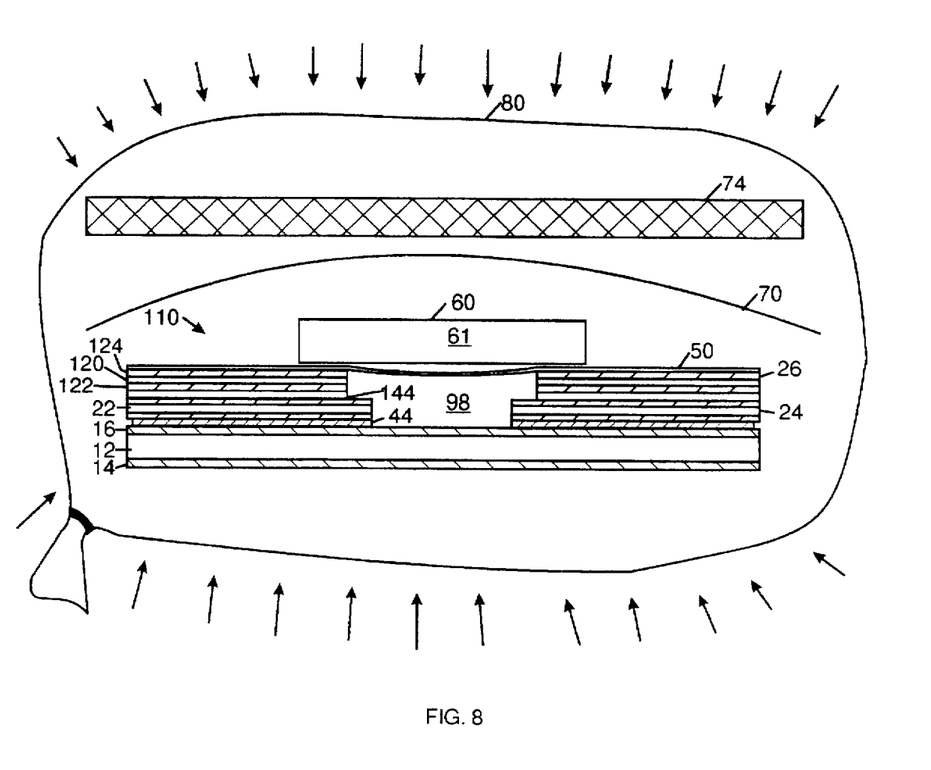
FIG. 8 illustrates components of another printed circuit board during an intermediate stage in fabrication according to another embodiment of the present invention.

FIG. 8 illustrates another embodiment of the present invention in which a stepped cavity 98 in a printed circuit board 110 is plugged with material 61. Printed circuit board 110 is identical to printed circuit board 10 except as follows. A metallized dielectric layer comprising a dielectric layer 120, metallization 122, metallization 124 and epoxy sticker sheet 144 are laid on metallization 26 before any lamination has occurred. Dielectric layer 120, metallization 122, metallization 124 and epoxy sticker sheet 140 are identical to dielectric layer 12, metallization 14, metallization 16 and epoxy sticker sheet 40, respectively except that the former have a larger window. Thus, the layers form the basis for stepped cavity 98. Then, release layer 50 and sheet 60 of material 61 are laid over the cavity.

Figure 9:
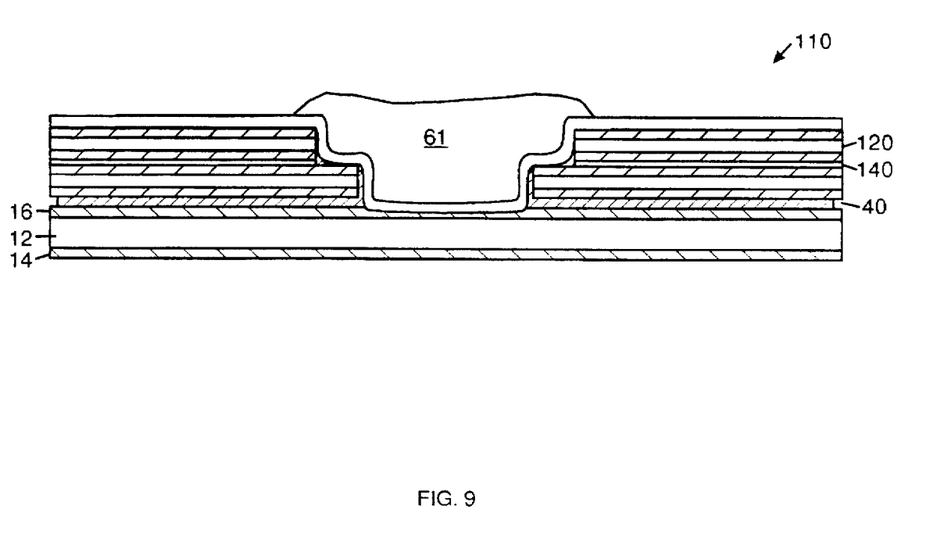
FIG. 9 illustrates the printed circuit board of FIG. 8 during a still later stage in the fabrication process.

Printed circuit board 110 is then subject to the same autoclaving process (including release layer 70, breather layer 74 and bag 80) as was printed circuit board 10 and the result is illustrated in FIG. 9. The material 61 has effectively plugged cavity 98 such that sticker material layers 40 and 140 have been dammed so that they form a fillet around the perimeter of the cavity 98.

Figure 10:
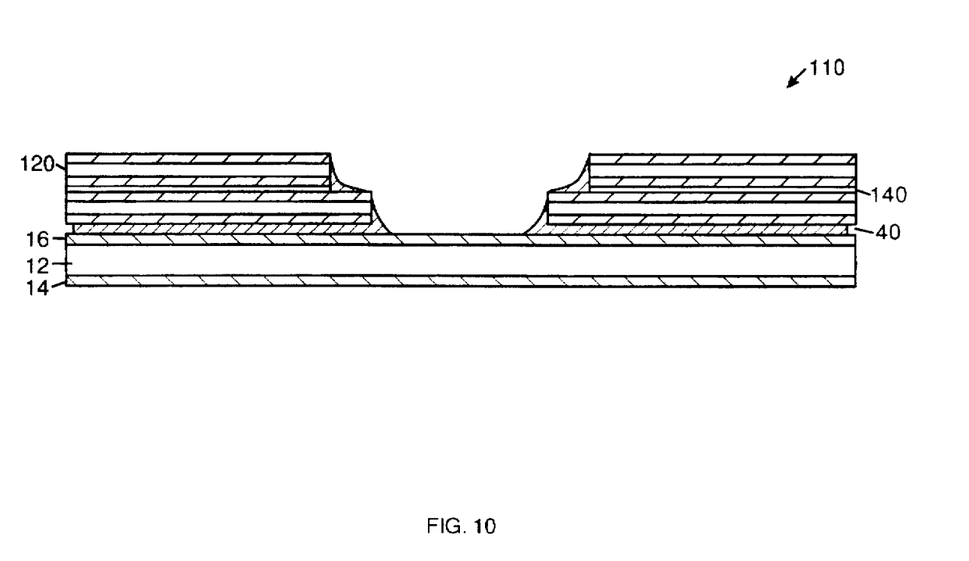
FIG. 10 illustrates the printed circuit board of FIG. 9 during a still later stage in the fabrication process, i.e. after the layers are laminated and a cavity is formed.

Next, the release layer 70, breather layer 74 and bag 80 are removed leaving printed circuit board 110 as illustrated in FIG. 10. Although not shown, if desired, cavity 98 could also be plated in the same manner that cavity 31 was plated.

Based on the foregoing, processes for fabricating printed circuit boards have been disclosed. However, numerous modifications and substitutions can be made without deviating from the scope of the present invention. For example, the foregoing fabrication process could also be used for cavities with multiple or tiered steps. Also, a flat bed press can be used instead of the autoclave to compress the structure of FIG. 3. However, when using the flat bed press, layer 70 is omitted to allow material 61 to bleed into the breather material 74. Also, when using the flat bed press, bag 80 is omitted and 300 PSI is applied at 350 degrees F. Therefore, the invention has been disclosed by way of illustration and not limitation and reference should be made to the following claims to determine the scope of the present invention.

We claim:

1. A method for fabricating a printed circuit board, said method comprising the steps of:
    laying a sticker sheet on a first, metallized dielectric layer;
    laying a second, metallized dielectric layer on said sticker sheet, said second metallized dielectric layer and said sticker sheet each having a window which is registered with the other window forming a cavity;
    laying a flexible release layer above said second metallized dielectric layer;
    laying a thermosetting visco-plastic material on said release layer over said cavity;
    subjecting said first and second metallized dielectric layers, sticker sheet, release layer and visco-plastic material to heat and pressure, said pressure forcing said visco-plastic material against a floor region of said cavity before the heat and pressure cause the sticker sheet to flow onto said floor region, said heat and pressure causing said sticker sheet to flow and conform to said visco-plastic material on said floor region, and curing said sticker sheet and thereby binding said first and second metallized dielectric sheets to each other.

2. The method as set forth in claim 1 wherein said pressure forces said visco-plastic material tightly into said cavity to seal a bottom periphery of said cavity before the heat and pressure cause the sticker sheet to flow beyond said seal, said heat and pressure causing said sticker sheet to flow and conform to said seal.

3. The method as set forth in claim 1 wherein said sticker sheet comprises pre-preg.

4. The method as set forth in claim 3 wherein said sticker sheet comprises moderate or high-flow pre-preg.

5. The method as set forth in claim 1 wherein said release layer comprises tetrafluoroethyleneperfluoroalkyl vinyl ether.

6. The method as set forth in claim 1 wherein the heat and pressure subjecting step is performed in an autoclave.

7. The method as set forth in claim 1 wherein said visco-plastic material is a sheet which spans said cavity and does not enter said cavity until the heat and pressure subjecting step is performed.

8. The method as set forth in claim 1 wherein the heat and pressure subjecting step comprises the step of enclosing the foregoing layers in a bag, sealing the bag, evacuating the bag and loading the sealed bag in an autoclave, the evacuation of the bag forcing the visco-plastic material against said floor region of said cavity.

9. The method as set forth in claim 1 wherein said visco-plastic material partially cross-links during heating, said partial cross-linking maintaining shape of said cavity despite softening of the noncross-linked elements due to the heat.

10. The method as set forth in claim 1 wherein the polymer and said release layer are conformable enough to seal a 0.001" crevice at room temperature and during the heating and pressure subjecting step.

11. The method as set forth in claim 1 wherein said release layer is laid on said second metallized dielectric layer.

12. The method as set forth in claim 1 further comprising the steps of:
    laying a second sticker sheet on said second metallized dielectric layer; and
    laying a third metallized dielectric layer on said second sticker sheet, said third metallized dielectric layer and said second sticker sheet each having a window which is registered with the other windows forming said cavity; and
    wherein said release layer is laid on said third metallized dielectric layer.

13. The method as set forth in claim 11 wherein said third metallized dielectric layer and said second sticker sheet have larger windows than that of said second metallized dielectric layer such that said cavity is stepped.

14. The method as set forth in claim 1 further comprising the subsequent steps of:
    removing said release layer and material; and
    after the removing step, plating said cavity.

15. A method for fabricating a printed circuit board, said method comprising the steps of:
    laying a sticker sheet on a first, metallized dielectric layer;
    laying a second, metallized dielectric layer on said sticker sheet, said second metallized dielectric layer and said sticker sheet each having a window which is registered with the other window forming a cavity;
    laying a release layer on said second metallized dielectric layer;
    laying a sheet of material on said release layer over said cavity, said material being soft and conformable at room temperature to seal a bottom periphery of said cavity yet viscous to effectively dam said periphery, said material partially cross-linking itself during heating to prevent said material from melting due to said heating; and subjecting said first and second metallized dielectric layers, sticker sheet, release layer and visco-plastic material to heat and pressure, said pressure forcing said material into said cavity to seal said bottom periphery of said cavity before the heat and pressure cause the sticker sheet to flow beyond said seal, said heat and pressure causing said sticker sheet to flow and conform to said seal and curing said sticker sheet to bind said first and second metallized dielectric layers to each other.

16. The method as set forth in claim 15 wherein said material and release layer are conformable enough to seal a 0.001" crevice at room temperature and during the heating and pressure subjecting step.

17. The method as set forth in claim 15 further comprising the subsequent steps of:

removing said release layer and material; and after the removing step, plating said cavity.

18. A method for fabricating a printed circuit board, said method comprising the steps of:

laying a sticker sheet on a first, metallized dielectric layer;

laying a second, metallized dielectric layer on said sticker sheet, said second metallized dielectric layer and said sticker sheet each having a window which is registered with the other window forming a cavity;

laying a release layer above said second metallized dielectric layer;

laying a sheet of material on said release layer in a position to subsequently seal a base perimeter of said cavity, said material being soft and conformable enough at room temperature to seal adjacent to a base perimeter yet viscous enough to effectively dam said base perimeter, said material partially cross-linking itself during heating to prevent said material from melting due to said heating; and subjecting said first and second metallized dielectric layers, sticker sheet, release layer and visco-plastic material to heat and pressure, said pressure forcing said material into said cavity to seal adjacent to said bottom perimeter of said cavity before the heat and pressure cause the sticker sheet to flow beyond said seal, said heat and pressure causing said sticker sheet to flow and conform to said seal, and curing said sticker sheet to bind said first and second metallized dielectric layers to each other.

* * * * *